United States Patent [19]
Oh

[11] Patent Number: 6,069,536
[45] Date of Patent: May 30, 2000

[54] RING OSCILLATOR INCLUDING CHAIN OF PLURAL SERIES-CONNECTED COMPARATORS CONTROLLING BY CLOCK

[75] Inventor: Young Nam Oh, Kyoungki-do, Rep. of Korea

[73] Assignee: Hyundai Electronics Industries Co., Ltd., Ichon-shi, Rep. of Korea

[21] Appl. No.: 09/222,363

[22] Filed: Dec. 29, 1998

[30] Foreign Application Priority Data

Dec. 31, 1997 [KR] Rep. of Korea ........................ 97-81294

[51] Int. Cl.[7] ...................................................... H03B 1/00
[52] U.S. Cl. .............................. 331/57; 331/185; 331/34; 331/177 R; 327/261
[58] Field of Search ................................ 331/57, 34, 185, 331/177 R; 327/261

[56] References Cited

U.S. PATENT DOCUMENTS 5,406,228  4/1995  Hoang ........................................ 331/1 A Primary Examiner—Arnold Kinkead
Assistant Examiner—Kimberly Glenn
Attorney, Agent, or Firm—Jacobson, Price, Holman & Stern, PLLC

[57] ABSTRACT

A ring oscillator generates a pulse signal having a frequency determined in response to a level change in the source voltage. For this, the ring oscillator comprises a voltage level detector for detecting an external source voltage and generating a reference voltage having a different level according to a voltage level of the clock signal, a chain unit for including a plurality of comparators which are connected in series and make a ring structure, each comparator comparing the reference voltage with an output signal of a preceding comparator in the ring structure under the control of the clock signal to thereby output an inverted signal, an output buffering unit for buffering the output signal of the chain unit and outputting the buffered signal, and an internal voltage providing unit for precharging the output terminal of the chain unit with an internal source voltage in a standby mode under the control of the clock signal, wherein the internal source voltage is being generated by voltage-dropping the external source voltage. By constructing the ring oscillator as above, the ring oscillator can minimize current consumption therein and more rapidly change the frequency of the pulse signal according to the level change of the source voltage.

6 Claims, 4 Drawing Sheets

RING OSCILLATOR INCLUDING CHAIN OF PLURAL SERIES-CONNECTED COMPARATORS CONTROLLING BY CLOCK

BACKGROUND OF THE INVENTION

1. Field of the Invention

The present invention relates to a ring oscillator used in a memory device adopting a charge pump and an on-chip timer; and, more particularly, to a ring oscillator including a comparator as a unit chain cell and, therefore, capable of minimizing its current consumption and rapidly changing a frequency of its output signal in response to a level change of a source voltage.

2. Description of the Prior Art

Referring to FIG. 1, there is provided a conventional ring oscillator which comprises an inverter chain unit 10 and an output buffering unit 12. The inverter chain unit 10 includes a plurality of inverters I1 to I4 connected in series; a NAND gate NAND1 whose two input terminals receive an output signal from the inverter I4 and external clock signal clk, respectively, and output terminal is connected to an input terminal of the inverter I1 via a second node N2. The output buffering unit 12 has a multiplicity of inverters, e.g., I5 and I6, connected in series, wherein an input terminal of the inverter I5 is connected to a first node N1 linking the output terminal of the inverter I4 and one of the input terminals of the NAND gate NAND1; and buffers the output signal of the inverter chain unit 10 to thereby provide the buffered output signal as its output signal osc1.

Hereinafter, the operation of the conventional ring oscillator shown in FIG. 1 will be illustrated.

First of all, if an external input control signal, i.e., the external clock signal clk, which is fed to the inverter chain unit 10 has a logic low state, the output signal of the NAND gate NAND1 maintains a logic high state since the NAND gate NAND1 is disabled. That is, the second node N2 has a logic high state. As a result, the output signal osc1 of the output buffering unit 12 which is connected to the inverter chain unit 10 via the first node N1 also maintains a logic high state and, therefore, there is no output pulse signal generated from the ring oscillator.

On the other hand, if the clock signal clk having a logic high state is inputted to the inverter chain unit 10, the NAND gate NAND1 is enabled and the output signal of the NAND gate NAND1, having an inverted level of an input voltage fed to the NAND gate NAND1 via the first node N1, is provided at the second node N2. As a result, a pulse signal having a predetermined frequency is generated from the NAND gate NAND1 as the voltage level of the first node N1 is continuously inverted. Also, the pulse signal generated at the first node N1 is buffered by the inverters I5 and I6 in the output buffering unit 12 and then outputted as the output pulse signal osc1.

However, the conventional ring oscillator consumes a substantial amount of current through the inverter chain unit 10 when the external clock signal clk has a logic high state and cannot perform a rapid frequency change following the source voltage change.

SUMMARY OF THE INVENTION

It is, therefore, an object of the invention to provide a ring oscillator capable of reducing current consumption at the inverter chain unit and rapidly changing a frequency when a source voltage level varies.

In accordance with the present invention, there is provided a ring oscillator comprising: a voltage level detector for detecting an external source voltage and generating a reference voltage having a different level according to a voltage level of a clock signal; a chain unit for including a plurality of comparators which are connected in series and make a ring structure, each comparator comparing the reference voltage with an output signal of a preceding comparator in the ring structure under the control of the clock signal to thereby output an inverted signal; an output buffering unit for buffering the output signal of the chain unit and outputting the buffered signal; and an internal voltage providing unit for precharging the output terminal of the chain unit with an internal source voltage in a standby mode under the control of the clock signal, wherein the internal source voltage is being generated by voltage-dropping the external source voltage.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
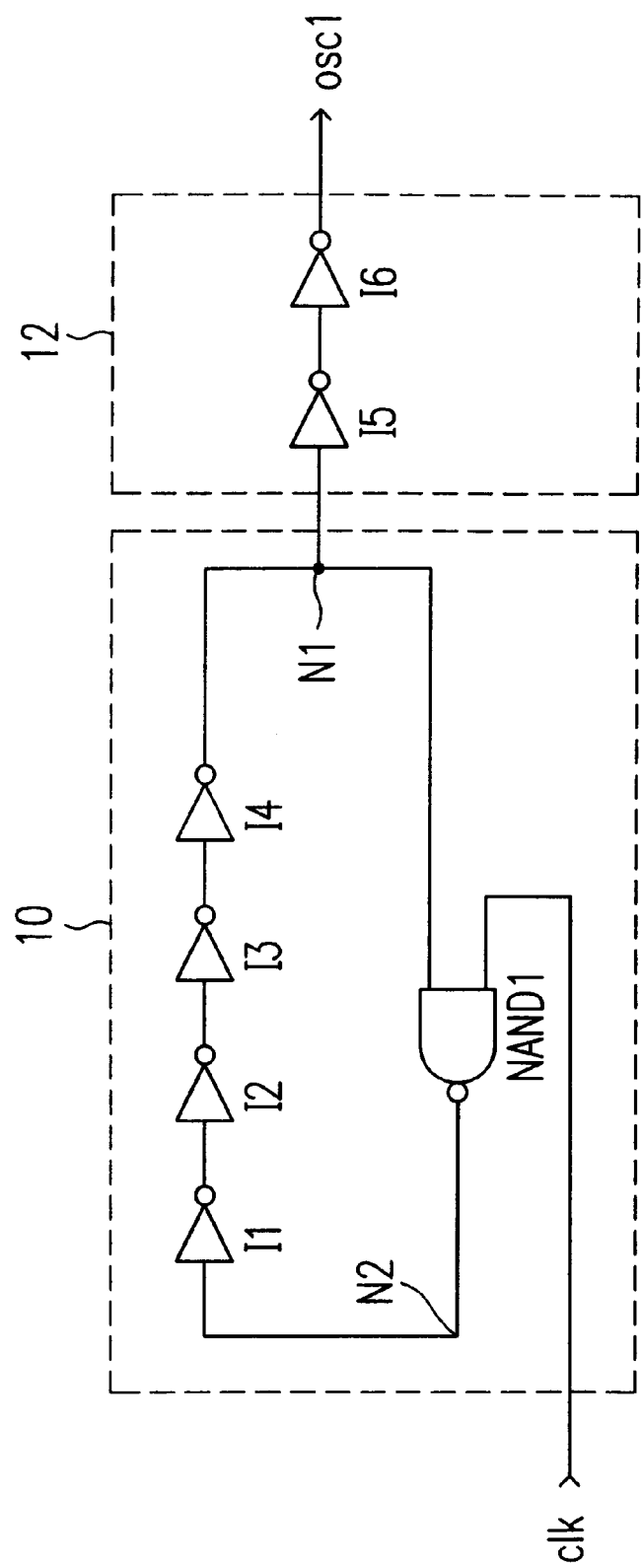
FIG. 1 shows a conventional ring oscillator.
Figure 2:
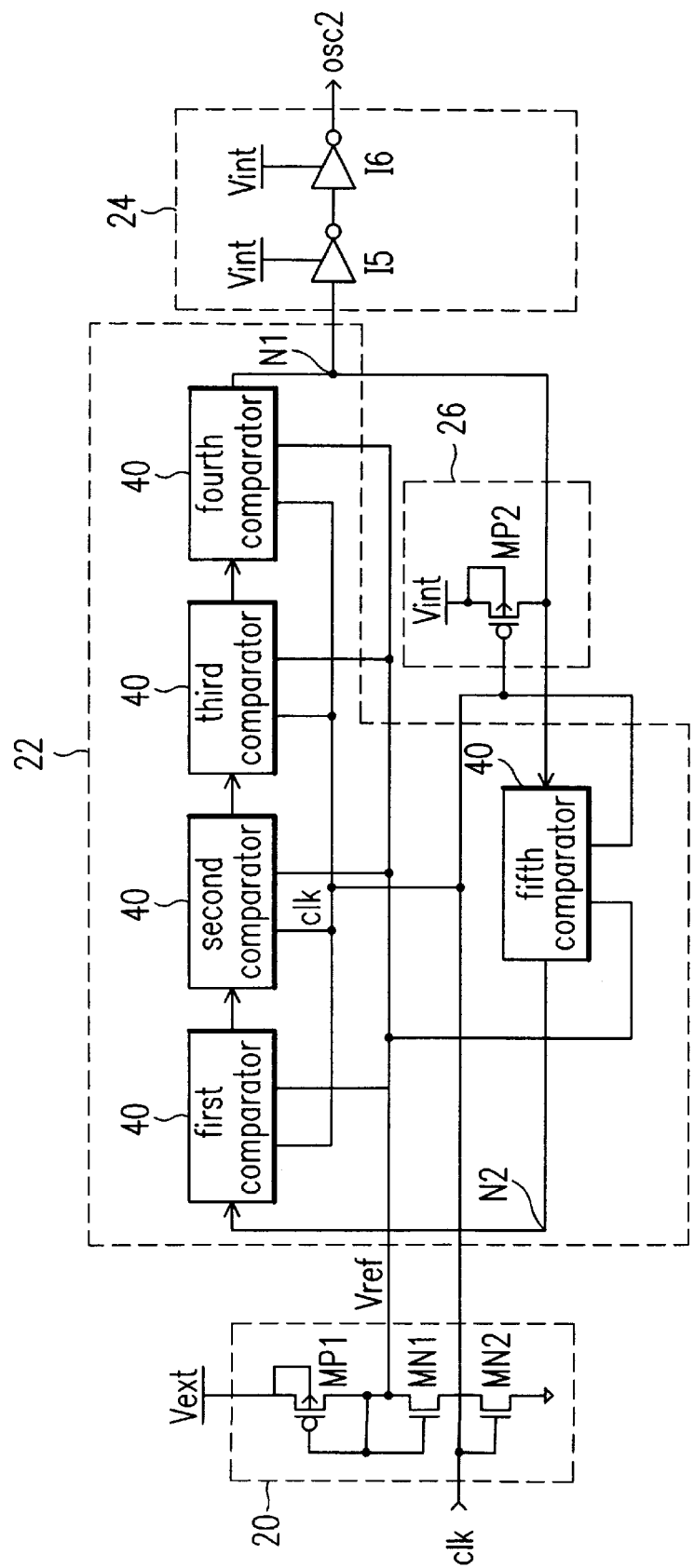
FIG. 2 provides a ring oscillator in accordance with a first embodiment of the present invention.

Referring to FIG. 2, there is shown a ring oscillator of a semiconductor memory device in accordance with a first embodiment of the present invention. The ring oscillator comprises a voltage level detector 20 which detects an external source voltage Vext to thereby generate a reference voltage Vref dependent on a voltage level of an external input control signal, i.e., a clock signal clk, fed thereto; a chain unit 22 including a plurality of comparators 40 which are connected in series and make a ring structure, each comparator comparing the reference voltage Vref fed thereto from the voltage level detector 20 with an output signal of its preceding comparator in the ring structure under the control of the clock signal clk and supplying an inverted signal to its next comparator; an output buffering unit 24 including a multiplicity of inverters, e.g., I5 and I6, thereby buffering the output signal of the chain unit 22 and providing the buffered signal as its output signal osc2; and an internal source voltage providing unit 26 which is controlled by the clock signal clk and precharges an output node N1 of the chain unit 22 with an internal source voltage Vint in a standby mode so as to reduce current consumption in the chain unit 22, wherein the internal source voltage Vint is generated by voltage-dropping the external source voltage Vext.

In FIG. 2, the voltage level detector 20 includes a diode-type PMOS transister MP1 connected between the external source voltage terminal Vext and the output terminal to which the reference voltage Vref is outputted; a diode-type NMOS transister MN1 connected to the PMOS transister MP1 in series; and NMOS transister MN2 which is connected between the NMOS transister MN1 and a ground voltage terminal and whose gate is controlled by the clock signal clk to thereby preclude current consumption during the standby mode.

In the voltage level detector 20, if the clock signal clk having a logic low state is fed thereto, the NMOS transister MN2 is turned off to thereby preclude the current consumption and the PMOS transister MP1 is turned on to thereby output a logic high signal through the output terminal Vref.

On the other hand, if the clock signal clk having a logic high state is coupled to the voltage level detector 20, there is a current flow from the external source voltage terminal Vext to the ground terminal since the NMOS transister MN2 is turned on. As a result, there is outputted a reference voltage, having a voltage level of Vext/2 corresponding to the external source voltage Vext, via the output terminal Vref of the voltage level detector 20.

The structure of the voltage level detector 20 illustrated in FIG. 2 can vary according to the frequency changes corresponding to the objects of the present invention.

Figure 3:
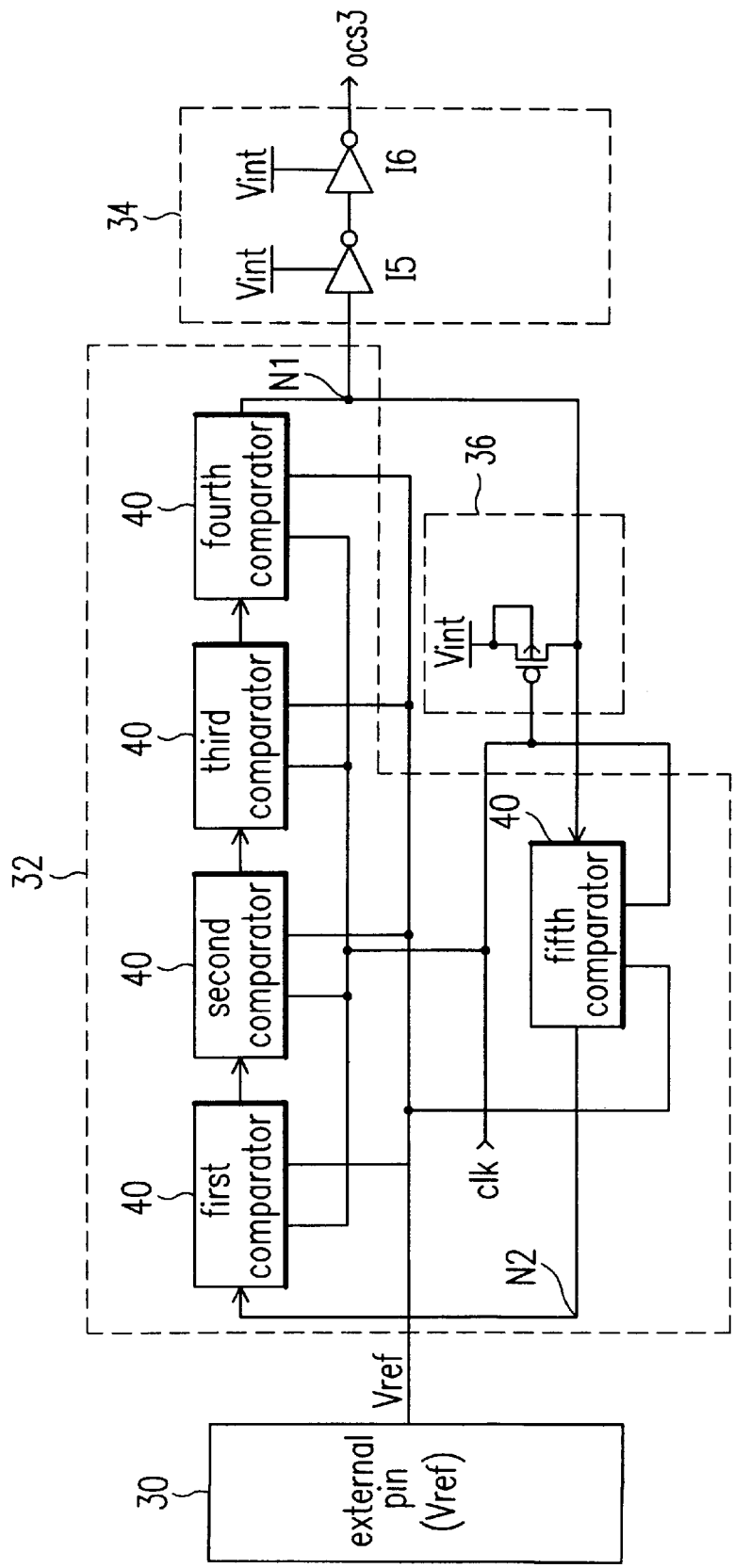
FIG. 3 represents a ring oscillator in accordance with a second embodiment of the present invention.

Referring to FIG. 3, there is shown a ring oscillator in accordance with a second embodiment of the present invention, wherein the reference voltage Vref is inputted via an external pin as a DC level instead of being generated by the voltage level detector 20 illustrated in FIG. 2. Since the operation of the ring oscillator in FIG. 3 is functionally identical to that of the ring oscillator in FIG. 2, a detailed description on the operation of the ring oscillator in FIG. 3 is omitted for the sake of simplicity.

Figure 4:
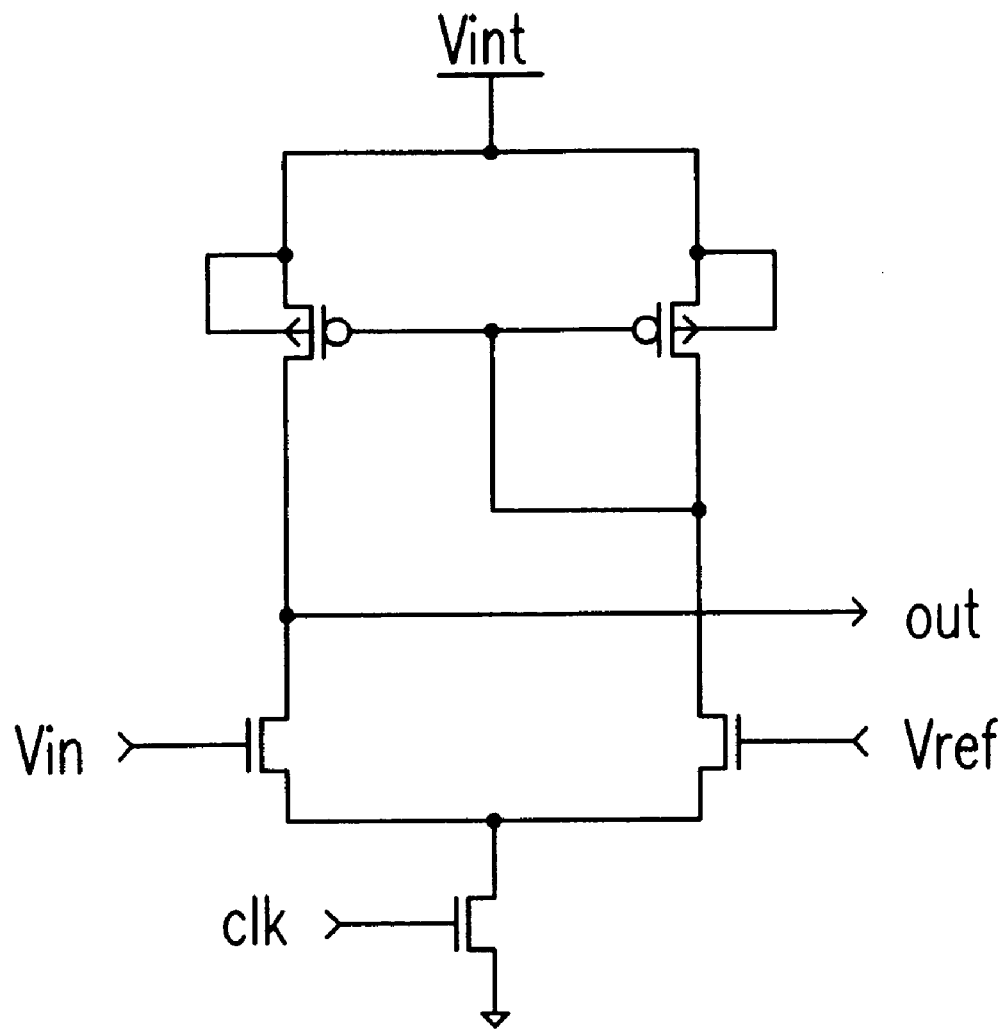
FIG. 4 depicts a comparator in FIGS. 2 and 3.

Referring to FIG. 4, there is depicted a comparator shown in FIGS. 2 and 3. The comparator is in a form of a differential amplifier having a current mirror, which provides a different output signal by comparing the reference voltage Vref and an input voltage Vin under the control of the clock signal clk.

That is, if the input voltage Vin is greater than the reference voltage Vref, an output signal out having a logic low state is generated and, if otherwise, the output signal out having a logic high state is produced. As a result, the output signal has an inverted signal of the input signal Vin.

Through the operation of the comparator, the chain unit 22 or 32 in FIG. 2 or 3 provides a pulse signal via its output node N1. The pulse signal generated from the chain unit 22 or 32 is buffered by the inverters I5 and I6 of the buffering unit 24 or 34 and thereafter, outputted as the output signal osc2 or osc3.

As illustrated above, the present invention comprises the internal source voltage providing unit 26 or 36 supplying the internal source voltage Vint as a driving voltage of each of the comparators 40 in order to reduce current consumption in the standby mode. The internal source voltage Vint can be coupled to the output node N1 of the chain unit 22 or 32 through the use of a PMOS transister MP2 which is connected between an internal source voltage providing terminal Vint and the output node N1 and whose gate is controlled by the clock signal clk.

If the clock signal clk has a logic high state and the external source voltage has a low level, the level of the reference voltage Vref generated at the voltage level detector 20 or 30 also has a low level. As a result, the current consumption at each of the comparators 40 decreases and a period of one cycle of the chain 22 or 32 increases. On the other hand, as the level of the external source voltage increases, the level of the reference voltage Vref generated at the voltage level detector 20 or 30 is also higher. As a result, the current consumption at each of the comparators 40 increases and, accordingly, the period of one cycle of the chain 22 or 32 decreases.

As shown above, since the voltage level detector 20 in accordance with the present invention provides a reference voltage whose voltage level varies dependent on the level change of the external source voltage, the pulse signal outputted from the ring oscillator can have a high-speed frequency change characteristic.

As can be seen above, in accordance with the present invention, the low power consumption is achieved because the ring oscillator can reduce a voltage swing by using the internal source voltage.

Also, the ring oscillator can perform a rapid frequency change following the source voltage change by using the reference voltage generated from the voltage level detector.

While the present invention has been described with respect to certain preferred embodiments only, other modifications and variations may be made without departing from the spirit and scope of the present invention as set forth in the following claims.

What is claimed is:

1. A ring oscillator comprising:
   a voltage level detector for receiving an external source voltage and generating a reference voltage having a different level according to a voltage level of a clock signal;
   a chain unit including a plurality of comparators which are connected in series and make a ring structure, wherein each comparator compares the reference voltage with an output signal of a preceding comparator in the ring structure under control of the clock signal to thereby output an inverted signal;
   an output buffering unit for buffering an output signal of the chain unit and for outputting a buffered signal; and
   an internal voltage providing unit for precharging an output terminal of the chain unit with an internal source voltage in standby mode under the control of the clock signal, wherein the internal source voltage is generated by voltage-dropping the external source voltage.

2. The ring oscillator as recited in claim 1, wherein the voltage level detector includes:
   a first NMOS transistor having a gate controlled by the clock signal and a source connected to a ground terminal; and
   a PMOS transistor and a second NMOS transistor connected in series between an external source voltage terminal and the first NMOS transistor.

3. The ring oscillator as recited in claim 1, wherein said each comparator includes:
   a differential amplifier that has a current mirror and that uses the internal source voltage as a driving voltage.

4. The ring oscillator as recited in claim 1, wherein:
   the internal voltage providing unit employs a PMOS transistor.

5. The ring oscillator as recited in claim 1, wherein the output buffering unit includes:
   a multiplicity of inverters using the internal source voltage as a driving voltage.

6. A ring oscillator comprising:
   a voltage level detector for outputting a source voltage provided by an external pin as a reference voltage;
   a chain unit including a plurality of comparators which are connected in series and make a ring structure, wherein each comparator compares the reference voltage with an output signal of a preceding comparator in the ring structure under control of a clock signal to thereby output an inverted signal to a following comparator;
   an output buffering unit for buffering an output signal of the chain unit and for outputting a buffered signal; and
   an internal voltage providing unit for precharging an output terminal of the chain unit with an internal source voltage in standby mode under control of the clock signal, wherein the internal source voltage is generated by voltage-dropping an external source voltage.

* * * * *